United States Patent [19]

Ehmke et al.

[11] Patent Number: 5,298,733
[45] Date of Patent: Mar. 29, 1994

[54] INFRARED FOCAL PLANE ARRAY WITH INTEGRAL SLOT SHIELD USING SPIN-ON EPOXY AND METHOD OF MAKING SAME

[75] Inventors: John C. Ehmke, Mesquite; James C. Baker, Coppell, both of Tex.

[73] Assignee: Texas Instruments Incorporated, Dallas, Tex.

[21] Appl. No.: 988,513

[22] Filed: Dec. 10, 1992

[51] Int. Cl.$^5$ .............................................. H01J 40/14
[52] U.S. Cl. .................................. 250/208.1; 257/435
[58] Field of Search ................. 250/208.1, 216, 338.1, 250/342; 257/433, 434, 435, 436, 443

[56] References Cited

U.S. PATENT DOCUMENTS 3,991,460  11/1976  Roberts ............................ 257/435
5,101,099   3/1992  Funada et al. .................. 250/208.1

*Primary Examiner*—David C. Nelms
*Attorney, Agent, or Firm*—Rene' E. Grossman; Richard L. Donaldson; B. Peter Barndt

[57] ABSTRACT

A method of fabricating a focal plane array having an integral slot shield which comprises fabricating a focal plane array having a plurality of detector elements. A layer of electrically insulating material, preferably a spun on epoxy, having a planar top surface is then formed over the array. A reflective layer is then formed over the layer of electrically insulating material and the electrically insulating layer and reflective layer are etched only in the regions thereof over the detector elements to form slots over said detector elements. The electrically insulating layer is etched with a directional etchant. The etched layer of electrically insulating material defines side walls in the slots, material from the side walls being removed to define non-planar sidewalls. The non-planar side walls preferably have an essentially sawtooth shape.

21 Claims, 1 Drawing Sheet

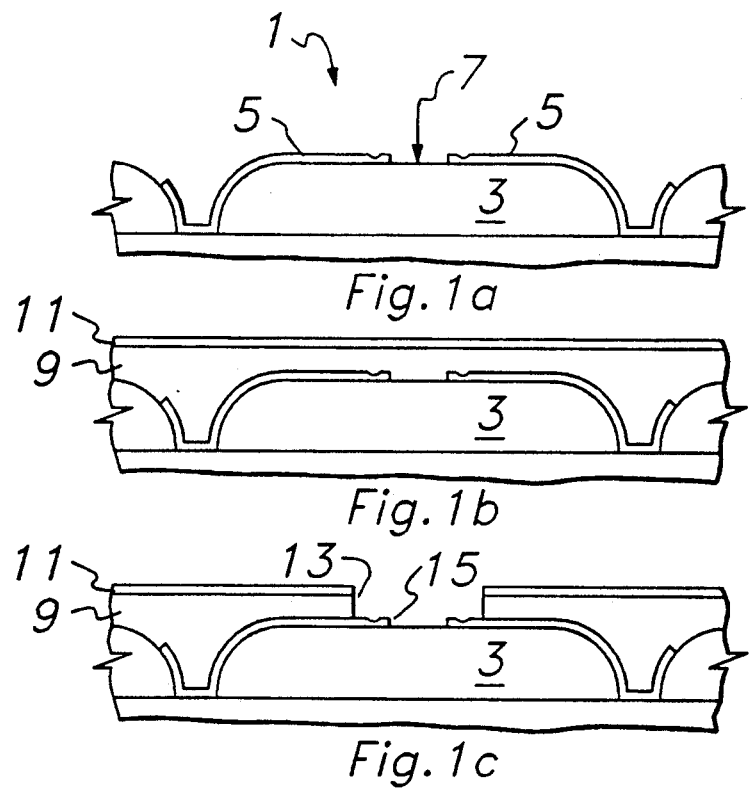
Fig. 1a
Fig. 1b
Fig. 1c
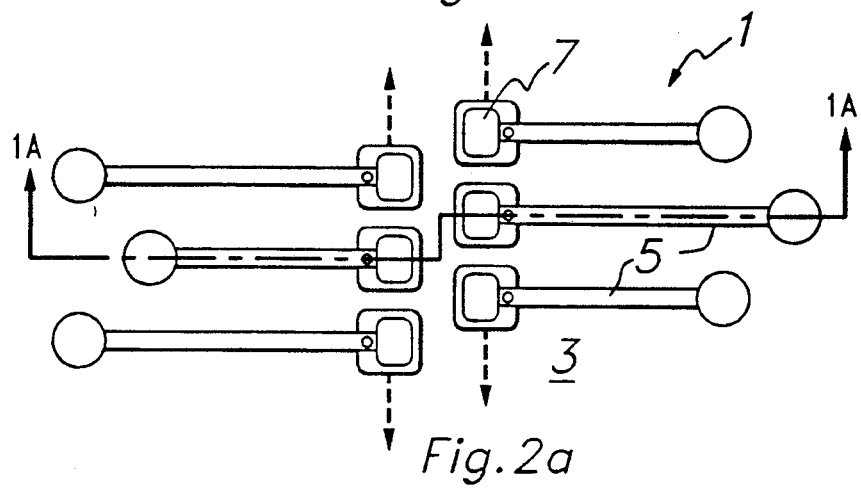
Fig. 2a
Fig. 2b

INFRARED FOCAL PLANE ARRAY WITH INTEGRAL SLOT SHIELD USING SPIN-ON EPOXY AND METHOD OF MAKING SAME

BACKGROUND OF THE INVENTION

1. Field of the Invention

This invention relates to focal plane arrays and, more specifically, to a slot shield for a focal plane array and method of fabricating the slot shield.

2. Brief Description of the Prior Art

When detecting incident energy transmitted from a remote source and primarily infrared energy, it is often desirable that the remote source not be aware that the energy it is transmitting is being detected. A problem in this regard is that focal plane arrays (FPAs), a principal devices used to receive incident energy and primarily infrared energy, tend to reflect the received energy along the incident energy path. It follows that the reflected energy can often be detected by the original transmitter whereby the original transmitter becomes aware that someone is detecting the energy being transmitted. In order to minimize the possibility that the transmitter will be aware that detection is taking place, it is necessary that the energy received by the detector either be absorbed, be reflected along a path other than the incident path or a combination thereof.

To minimize reflection along the incident path, focal plane arrays generally are provided with a slot shield on the surface thereof. Slot shields are generally a layer of reflective material, disposed on the surface of the FPA with a slot therein over the detector region to permit IR to pass through the slot to the detector. The purpose of the slot shield is to prevent or at least minimize reflection of incident energy impinging upon the detector along its incident path so that reflected energy cannot be picked up by the original transmitter thereof along its incident path. The shield portion of the slot shield which defines the slot is formed from a specular, absorptive material, generally doped silicon. The slot shield operates on the theory that most of the energy impinging upon the detector is travelling at an acute or obtuse angle relative thereto and that such energy will therefore be reflected along a path other than the incident path.

In accordance with the prior art fabrication procedures for slot shields, the slot shield was fabricated from thin layers of silicon, then secured with an epoxy and aligned on a previously fabricated infrared focal plane array. Problems encountered with prior art infrared focal plane array slot shields are poor suitability to mass production in that a great deal of labor is involved in their fabrication, low fabrication yield, possible device damage during mount and alignment and restricted placement tolerance due to alignment capability. It is therefore apparent that an improved procedure for fabrication of slot shields for focal plane arrays is highly desirable.

SUMMARY OF THE INVENTION

In accordance with the present invention, the above noted problems encountered with slot shields are minimized. In conjunction with the fabrication procedures for the focal plane array, an electrically insulating layer with a planar top surface and preferably a spin-on epoxy process is utilized with a reflective hard mask surface over the epoxy to provide a slot shield with closer alignment capability and wherein the slot shield is fabricated as part of the infrared focal plane array fabrication procedure rather than as a separate procedure after fabrication of the focal plane array with subsequent mounting on the array.

The process of spinning the epoxy onto the surface of the focal plane array involves spinning of the wafer on which fabrication is taking place at from about 800 to about 8000 RPM, preferably about 3500 RPM. The epoxy is the dispensed onto the surface of the wafer and the wafer is then spun in a plane normal to its axis. The result is a very thin planarized layer of epoxy on the surface of the wafer of controllable thickness of from about 3 microns to about 25 microns and preferably about 5 microns. The epoxy is apparently planarized because it has no solvents to drive out and sets by the chemical reaction of cross-linking. A thin 1000 to 6000 angstrom and preferably about 2000 angstrom planar layer of highly reflective metallization, preferably tungsten, is then formed by sputter deposition over the epoxy layer. The surface of the metallization is then patterned with a resist and the metal is etched away with fluorine-based plasma to later expose the epoxy. The epoxy is then etched in the same manner with a directional etchant, such as oxygen based biased-substrate etch, over the opening in the reflective layer to the IR sensing portions of the focal plane array.

Briefly, the focal plane array is initially fabricated in standard manner. Then the epoxy is spun over the surface of the array as described above. The spin-on epoxy provides a planarized surface since a spin-on epoxy process planarizes even large topographies with a relatively thin film due to the lack of shrinkage thereof during cure. The hard mask layer is then deposited over the epoxy, a resist is then formed over the hard mask for etching of the slot in the slot shield. The hard mask is then etched and the epoxy is then anisotropically etched to form the slot. The epoxy and hard mask remain over the reflective metal surrounding the slot with a sidewall of the epoxy exposed. The exposed sidewall of the epoxy can be further etched with the same pattern that formed the slot to provide a sawtooth shape so that energy impinging thereon will be reflected away from the incident path.

BRIEF DESCRIPTION OF THE DRAWING

FIGS. 1A to 1C provide a process flow for the process in accordance with the present invention;
FIG. 2A is a top view of FIG. 1A; and
FIG. 2B is a top view of FIG. 1C.

DESCRIPTION OF THE PREFERRED EMBODIMENT

Referring first to FIGS. 1A and 2A, there are shown two detector elements of a standard focal plane array 1. The detector element of the array includes an infrared energy sensitive semiconductor substrate 3, preferably of mercury cadmium telluride, with a reflective metal layer 5 thereover which can be used as an interconnect and is preferably formed of tungsten. A portion of the reflective layer 5 is removed over the optically sensitive portion of the substrate 3 in the form of windows 7 so that the only energy reaching the substrate passes through the windows 7. The structure of FIGS. 1A and 2A is the same as is found during the prior art fabrication of infrared focal plane arrays. However, in the prior art, the structure of FIG. 1A was the completed structure and a slot shield was then separately fabricated and manually aligned and secured with an epoxy to the focal plane array.

In accordance with the present invention, the structure of FIGS. 1A and 2A does not complete the fabrication process. The process continues as shown in FIG. 1B by spinning an epoxy 9, such as, for example, Ablebond 642-1, over the surface of the structure of FIGS. 1A and 2A. The spin on process includes the steps of heating the epoxy in a convection oven to 100° C. for two minutes and then dispensing the heated epoxy through a 0.5 micron filter onto the slice. The slice is heated on a hot plate to 65° C. for 45 seconds and the slice is moved to a spinner. The slice is then heat soaked for 45 seconds at standstill with an infrared lamp and then spun at 3500 RPM for ten seconds. The slice is then baked in a convection oven at 100° C. for 6 hours. The spun on epoxy has the property of forming an essentially planar top or exterior surface. A reflective metal layer 11, preferably tungsten, is then conformally formed in standard manner over the epoxy layer 9, the layer 11 being essentially planar as shown in FIG. 1B. The reflective layer 11 is then patterned with a resist in standard manner and the portion of the layer 11 disposed over the windows 7 and a small additional amount thereof is etched away in standard manner with fluorine-based plasma so that a portion of the reflective layer 5 is ultimately exposed. The portion of epoxy layer 9 directly below the portion of the reflective layer 11 which has been etched away is now also etched away anisotropically down to the reflective layer 5 to provide the structure as shown in FIGS. 1C and 2B.

As an alternative embodiment, the exposed sidewall portion 13 of the epoxy layer 9 can be further patterned with the same pattern that formed the slot to form a sawtooth shaped sidewall. This will cause energy impinging upon the epoxy sidewalls 13 to be reflected away from the path of the incident energy.

Referring to FIGS. 1C and 2B, there is shown a portion 15 of the reflective layer 5 extending into the slot formed by the epoxy layer 9 and reflective layer 11. This portion 15 is preferably wedge shaped in order to further disperse incident energy away from the incident energy path.

It can be seen that there has been provided a procedure whereby a slot shield is formed on a focal plane array as part of the initial focal plane array fabrication procedure without the requirement of manual attachment and alignment of a separately fabricated slot shield thereto.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modification.

We claim:

1. A method of fabricating a focal plane array having a slot shield, comprising the steps of:
   (a) fabricating a focal plane array having a plurality of detector elements;
   (b) forming over said array a layer of electrically insulating material having a planar top surface;
   (c) forming a reflective layer over said layer of electrically insulating material; and
   (d) forming slots over said detector elements through said electrically insulating layer and said reflective layer.

2. The method of claim 1 wherein said step of forming comprises etching said reflective layer and then etching said electrically insulating layer with a directional etchant.

3. The method of claim 1 wherein said electrically insulating material is an epoxy.

4. The method of claim 2 wherein said electrically insulating material is an epoxy.

5. The method of claim 3 wherein said step (b) comprises spinning said epoxy onto said focal plane array.

6. The method of claim 4 wherein said step (b) comprises spinning said epoxy onto said focal plane array.

7. The method of claim 1 wherein said layer of electrically insulating material defines side walls in said slots, further including the step of removing material from said sidewalls to define non-planar sidewalls.

8. The method of claim 3 wherein said layer of electrically insulating material defines side walls in said slots, further including the step of removing material from said sidewalls to define non-planar sidewalls.

9. The method of claim 5 wherein said layer of electrically insulating material defines side walls in said slots, further including the step of removing material from said sidewalls to define non-planar sidewalls.

10. The method of claim 7 wherein said layer of electrically insulating material defines side walls in said slots, further including the step of removing material from said sidewalls to define non-planar sidewalls.

11. The method of claim 7 wherein said non-planar side walls have an essentially sawtooth shape.

12. The method of claim 8 wherein said non-planar side walls have an essentially sawtooth shape.

13. The method of claim 9 wherein said non-planar side walls have an essentially sawtooth shape.

14. The method of claim 10 wherein said non-planar side walls have an essentially sawtooth shape.

15. A focal plane array system comprising:
   (a) a focal plane array having a plurality of detector elements;
   (b) a layer of electrically insulating material having a planar top surface disposed over said array;
   (c) a reflective layer over said layer of electrically insulating material;
   (d) said insulating layer and said reflective layer having slots therein disposed over said detector elements.

16. The array of claim 15 wherein said electrically insulating material is an epoxy.

17. The array of claim 15 wherein said layer of electrically insulating material defines non-planar side walls in said slots.

18. The array of claim 16 wherein said layer of electrically insulating material defines non planar side walls in said slots.

19. The array of claim 17 wherein said non-planar side walls have an essentially sawtooth shape.

20. The array of claim 18 wherein said non-planar side walls have an essentially sawtooth shape.

21. The array of claim 15 wherein said reflective layer is tungsten.

* * * * *